(12) United States Patent
Petrov et al.

(10) Patent No.: US 11,264,198 B2
(45) Date of Patent: Mar. 1, 2022

(54) OBJECTIVE LENS ARRANGEMENT

(71) Applicant: Applied Materials Israel Ltd., Rehovot (IL)

(72) Inventors: Igor Petrov, Rehovot (IL); Zvika Rosenberg, Mevaseret Zion (IL); Arie Bader, Nes-Ziona (IL)

(73) Assignee: Applied Materials Israel Ltd., Rehovot (IL)

( * ) Notice: Subject to any disclaimer, the term of this patent is extended or adjusted under 35 U.S.C. 154(b) by 144 days.

(21) Appl. No.: 16/160,906

(22) Filed: Oct. 15, 2018

(65) Prior Publication Data
US 2020/0118785 A1 Apr. 16, 2020

(51) Int. Cl.
*G02B 21/02* (2006.01)
*H01J 37/145* (2006.01)
*H01J 37/28* (2006.01)

(52) U.S. Cl.
CPC ............ *H01J 37/145* (2013.01); *H01J 37/28* (2013.01)

(58) Field of Classification Search
CPC ...... H01J 37/145; H01J 37/21; H01J 37/1475; H01J 37/10; H01J 2237/0458; H01J 2237/0492; H01J 2237/1205; H01J 37/28; G02B 7/09; G02B 7/021
USPC ......................................................... 359/656
See application file for complete search history.

(56) References Cited

U.S. PATENT DOCUMENTS

| | | | | |
|---|---|---|---|---|
| 6,590,210 B1* | 7/2003 | Essers | .................... | H01J 37/244 250/397 |
| 2004/0211913 A1* | 10/2004 | Petrov | .................... | H01J 37/145 250/396 R |
| 2006/0255288 A1* | 11/2006 | Petrov | .................... | H01J 37/026 250/398 |
| 2009/0200463 A1 | 8/2009 | Degenhardt et al. | | |
| 2011/0210181 A1* | 9/2011 | Edinger | ............ | H01L 21/76894 239/3 |
| 2013/0214155 A1* | 8/2013 | Winkler | .................. | H01J 37/28 250/307 |
| 2017/0213696 A1* | 7/2017 | Litman | .................... | H01J 37/28 |

FOREIGN PATENT DOCUMENTS

| | | |
|---|---|---|
| JP | H10-199459 A | 7/1998 |
| JP | 2008-004329 A | 1/2008 |

OTHER PUBLICATIONS

International Search Report and Written Opinion for Application No. PCT/US2019/051773 dated Jan. 3, 2020, 11 pages.
International Preliminary Report on Patentability for Application No. PCT/US2019/051773, dated Apr. 29, 2021, 8 pages.

* cited by examiner

*Primary Examiner* — Mahidere S Sahle
(74) *Attorney, Agent, or Firm* — Kilpatrick Townsend & Stockton LLP

(57) ABSTRACT

An objective lens arrangement that may include a magnetic lens and an electrostatic lens. The magnetic lens may include one or more coils, an upper polepiece and a lower polepiece. The electrostatic lens may include an upper electrode, an internal lower electrode and an external lower electrode. A majority of the internal lower electrode may be surrounded by a majority of the external lower electrode. The upper electrode, the internal lower electrode, and the external lower electrode are arranged in a coaxial relationship along an optical axis of the objective lens arrangement. An area of a bottom aperture of the external lower electrode may not exceed an area of a bottom aperture of the internal lower electrode.

19 Claims, 3 Drawing Sheets

OBJECTIVE LENS ARRANGEMENT

BACKGROUND OF THE INVENTION

Charged particle beam columns are typically employed in scanning electron microscopy, which is a known technique widely used in the manufacture of semiconductor devices, being utilized in critical dimension (CD) metrology tools, the so-called CD scanning electron microscope (SEM) and defect review SEM (DR-SEM).

In a SEM, the region of an object to be examined is two-dimensionally scanned by means of a focused primary beam of electrically charged particles, usually electrons. Irradiation of the object with the primary electron beam releases secondary electrons and/or backscattered electrons.

The secondary electrons are released at that side of the object at which the primary electron beam is incident, and move back to be captured by a detector, which generates an output electric signal proportional to the so-detected electric current. The energy distribution or the energy of the secondary electrons is indicative of the nature and composition of the object.

One of the common goals of all imaging systems includes increasing the image resolution to provide nanometric scale resolution.

The generation of an image having a nanometric scale resolution requires complex optics and is associated with aberrations and beam drifts.

There is a growing need to provide an objective lens arrangement that simplifies the optics of a SEM and exhibits low aberrations.

SUMMARY

There may be provided an objective lens arrangement as illustrated in at least one out of the specification and the drawings.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
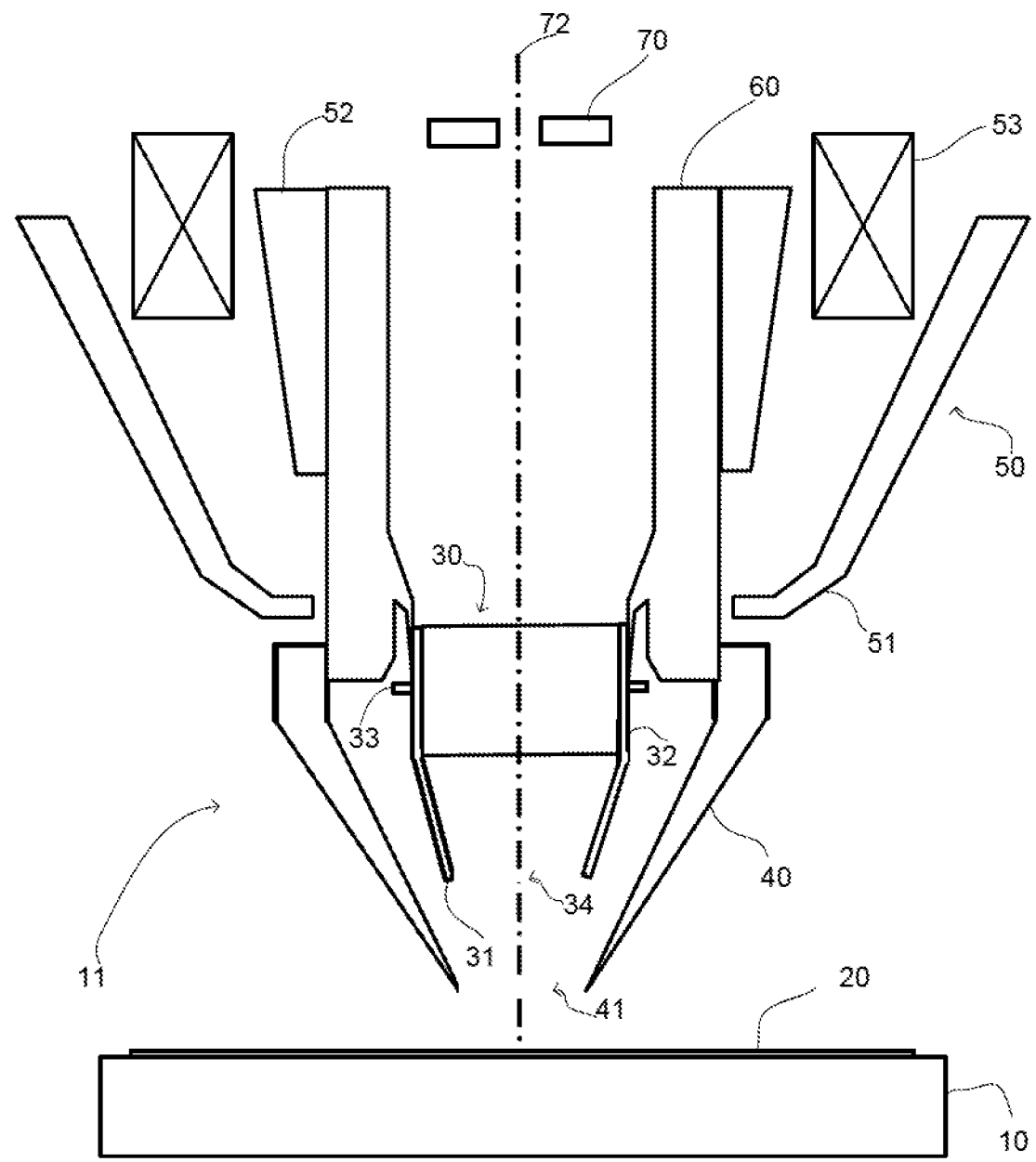
FIG. 1 illustrates an example of an objective lens arrangement, an object and additional parts of a SEM.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

FIG. 1 illustrates an object 20, an objective lens arrangement 11, an in-lens detector 70, and a chuck 10.

Chuck 10 supports the object 20.

The objective lens arrangement 11 includes a magnetic lens 50 and an electrostatic lens.

The magnetic lens 50 includes one or more coils 53, an upper polepiece 52 and a lower polepiece 51. The one or more coils 53 may be positioned between the upper polepiece and the lower polepiece.

The electrostatic lens includes an upper electrode 60, an internal lower electrode 30 and an external lower electrode 40. It should be noted that the object 20 also acts as one of the electrodes of the electrostatic lens.

The upper electrode 60, the internal lower electrode 30, and the external lower electrode 40 are arranged in a coaxial relationship along an optical axis 72 of the objective lens arrangement 11.

The upper polepiece 52 may contact the upper electrode 60 and may be electrically coupled to the upper electrode 60.

The upper electrode 60 may be electrically coupled to the internal lower electrode 30 thereby setting the voltage of the internal lower electrode 30 in a simple and efficient manner.

The lower polepiece 51 may be electrically isolated from the external lower electrode 40.

A majority of the internal lower electrode 30 is surrounded by a majority of the external lower electrode 40. Majority may mean more than fifty percent of the height, or more than fifty percent of the volume, and the like.

The top of the external lower electrode 40 is lower than the top of the internal lower electrode 30. The bottom of the external lower electrode 40 is lower than the bottom of the internal lower electrode 30.

Figure 2:
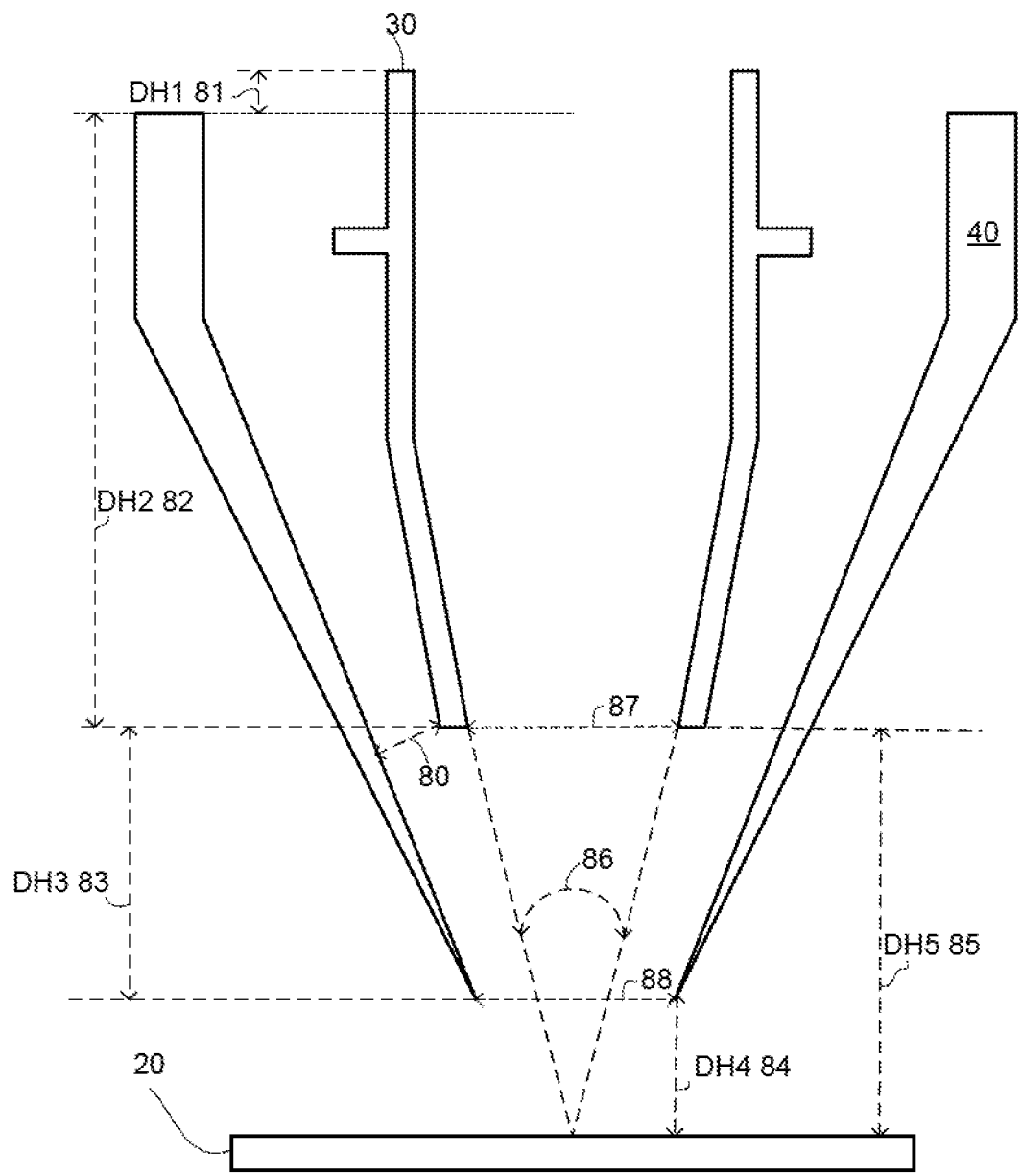
FIG. 2 illustrates an example of some parts of an objective lens arrangement, and an object.
Figure 3:
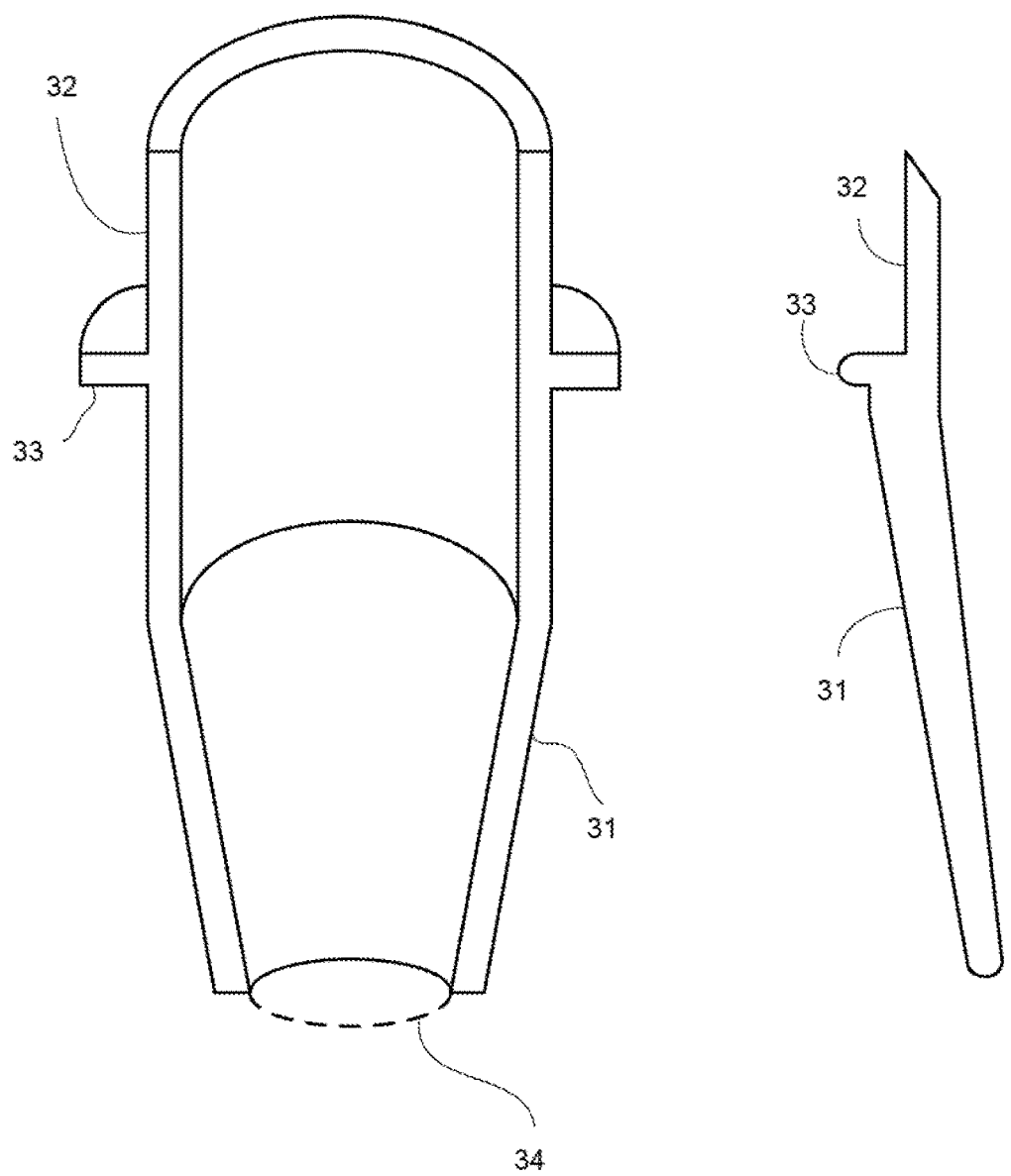
FIG. 3 illustrates examples of an internal lower electrode.

Referring to FIG. 2:
a. There is a first height difference (DH1) 81 between the top of the external lower electrode 40 to the top of the internal lower electrode 30.
b. There is a second height difference (DH2) 82 between the top of the external lower electrode 40 to the bottom of the internal lower electrode 30.
c. There is third height difference (DH3) 83 between the bottom of the external lower electrode 40 to the bottom of the internal lower electrode 30.

d. There is fourth height difference (DH4) 84 between the bottom of the external lower electrode 40 to the object 20.

e. There is a fifth height difference (DH5) 85 between the bottom of the internal lower electrode 30 to the object 20.

f. The bottom opening 34 of the internal lower electrode 30 and the illumination spot on the object form a virtual cone having an opening (at the base of the virtual cone) of angular range 86.

g. There is a minimal distance 80 between the external lower electrode 40 to the internal lower electrode 30.

h. The diameter 88 of a bottom opening 41 of the external lower electrode may or may not exceed a diameter 87 of a bottom opening 34 of the internal lower electrode.

DH4 84, DH5 85, minimal distance 80, diameter 88, diameter 87 may be of a millimetric scale—for example below a centimeter and above 0.1 millimeters.

The angular range 86 may range between twenty and seventy degrees.

DH1 81, DH2, DH3 may be of a millimetric scale or of a centimetric scale.

Because the majority of the internal lower electrode 30 is surrounded by the majority of the external lower electrode 40—second height difference DH2 exceeds each one of the first height difference DH1 81 and the third height difference DH2 83. DH2>DH1 and DH2>DH3.

Because the majority of the internal lower electrode 30 is surrounded by the majority of the external lower electrode 40, the internal lower electrode 30 reduces and even prevents the uncontrolled charging of the upper electrode 60 by backscattered electrons emitted from the object. This unwanted charging forms a parasitic electrostatic field that may introduce primary beam shift and stigmation. The primary beam shift and stigmation are reduced and even prevented by the suggested objective lens arrangement.

The minimal distance 80 between the external lower electrode 40 to the internal lower electrode 30 may exceed an arcing distance in which arcs are formed—thereby preventing the formation of arcs between the external lower electrode 40 and the internal lower electrode 30. The minimal distance may be set according to the expected operational parameters of the objective lens arrangement.

The bottom opening of the internal lower electrode 30 may be close enough (for example one or few millimeters) to the object and may be wide enough to collect electrons emitted over a large angular collection range.

The angular collection range includes the angles of emission of electrons from the object—the may reach the internal lower electrode. The angular collection range exceeds angular range 86 because the trajectory of the electrons is not linear—and the electrons emitted from the object are drawn towards the objective lens arrangement. The wide angular collection range allows an in-lens detector 70 to collect topographic information about the object. Accordingly—a SEM that includes the objective lens arrangement may not require an out of lens detector—thereby simplifying the SEM.

The suggested objective lens arrangement exhibits a short focal length of the objective lens of the column, and a deceleration of the electron beam at a shorter distance, which as a consequence reduces the coefficients of spherical and chromatic aberration and improves the resolution.

Aberrations are reduced by a combination of (a) the millimetric order distance between the bottom of the external lower electrode and the bottom of the internal lower electrode, and (b) by setting of the internal lower electrode to a high potential—such as the potential of the internal upper electrode.

The internal lower electrode 30 may include a cylindrical portion 32 that is positioned above a conical frustum shaped portion 31. The height of the cylindrical portion may equal the height of the conical frustum shaped portion. Alternatively—the height of the cylindrical portion may differ from the height of the conical frustum shaped portion.

The internal lower electrode 30 may also include an external interface 33 that is connected to an exterior of the cylindrical portion. The external interface 33 may be connected to the upper electrode 60—especially to the bottom of the upper electrode 60.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. An objective lens arrangement, comprising:
a magnetic lens; and
an electrostatic lens;
wherein the magnetic lens comprises one or more coils, an upper polepiece and a lower polepiece;
wherein the electrostatic lens comprises an upper electrode, an internal lower electrode and an external lower electrode; wherein a majority of the internal lower electrode is surrounded by a majority of the external lower electrode;
wherein the upper electrode, the internal lower electrode, and the external lower electrode are arranged in a coaxial relationship along an optical axis of the objective lens arrangement;
wherein the internal lower electrode includes an external interface that electrically couples the internal lower electrode to the upper electrode; and
wherein an area of a bottom aperture of the external lower electrode does not exceed an area of a bottom aperture of the internal lower electrode.

2. The objective lens arrangement according to claim 1 wherein an exterior of the majority of the internal lower electrode is spaced apart from an interior of the majority of the external lower electrode by a distance that exceeds an arcing distance.

3. The objective lens arrangement according to claim 1 wherein the internal lower electrode comprises a cylindrical portion that is positioned above a conical frustum shaped portion.

4. The objective lens arrangement according to claim 3 wherein a height of the cylindrical portion equals a height of the conical frustum shaped portion.

5. The objective lens arrangement according to claim 3 wherein a height of the cylindrical portion differs from a height of the conical frustum shaped portion.

6. The objective lens arrangement according to claim 3 wherein the external interface of the internal lower electrode is connected to an exterior of the cylindrical portion.

7. The objective lens arrangement according to claim 1 wherein the external interface of the internal lower electrode is connected to the upper electrode.

8. The objective lens arrangement according to claim 1 wherein the upper polepiece is electrically coupled to the upper electrode and wherein the lower polepiece is electrically isolated from the external lower electrode.

9. The objective lens arrangement according to claim 1 wherein the electrostatic lens consists of the upper electrode, the internal lower electrode and the external lower electrode.

10. An objective lens arrangement, comprising:
a magnetic lens; and
an electrostatic lens;
wherein the magnetic lens comprises one or more coils, an upper polepiece and a lower polepiece;
wherein the electrostatic lens comprises an upper electrode, an internal lower electrode and an external lower electrode; wherein a majority of the internal lower electrode is surrounded by a majority of the external lower electrode;
wherein the upper electrode, the internal lower electrode, and the external lower electrode are arranged in a coaxial relationship along an optical axis of the objective lens arrangement;
wherein the upper polepiece is electrically coupled to the upper electrode and wherein the lower polepiece is electrically isolated from the external lower electrode; and
wherein an area of a bottom aperture of the external lower electrode does not exceed an area of a bottom aperture of the internal lower electrode.

11. The objective lens arrangement according to claim 10 wherein an exterior of the majority of the internal lower electrode is spaced apart from an interior of the majority of the external lower electrode by a distance that exceeds an arcing distance.

12. The objective lens arrangement according to claim 10 wherein the internal lower electrode comprises a cylindrical portion that is positioned above a conical frustum shaped portion.

13. The objective lens arrangement according to claim 10 wherein the internal lower electrode includes an external interface that electrically couples the internal lower electrode to the upper electrode.

14. The objective lens arrangement according to claim 13 wherein the external interface is connected to the upper electrode.

15. An objective lens arrangement, comprising:
a magnetic lens; and
an electrostatic lens;
wherein the magnetic lens comprises one or more coils, an upper polepiece and a lower polepiece;
wherein the electrostatic lens comprises an upper electrode, an internal lower electrode and an external lower electrode; wherein a majority of the internal lower electrode is surrounded by a majority of the external lower electrode;

wherein the upper electrode, the internal lower electrode, and the external lower electrode are arranged in a coaxial relationship along an optical axis of the objective lens arrangement;

wherein the internal lower electrode is electrically coupled to the upper electrode; and wherein an area of a bottom aperture of the external lower electrode does not exceed an area of a bottom aperture of the internal lower electrode.

16. The objective lens arrangement according to claim 15 wherein an exterior of the majority of the internal lower electrode is spaced apart from an interior of the majority of the external lower electrode by a distance that exceeds an arcing distance.

17. The objective lens arrangement according to claim 15 wherein the internal lower electrode comprises a cylindrical portion that is positioned above a conical frustum shaped portion.

18. The objective lens arrangement according to claim 15 wherein the internal lower electrode includes an external interface that electrically couples the internal lower electrode to the upper electrode.

19. The objective lens arrangement according to claim 18 wherein the external interface is connected to the upper electrode.

* * * * *